(12) United States Patent
Cai et al.

(10) Patent No.: US 9,564,239 B2
(45) Date of Patent: Feb. 7, 2017

(54) MEMORY CONTROLLER AND OPERATING METHOD THEREOF

(71) Applicant: SK hynix memory solutions inc., San Jose, CA (US)

(72) Inventors: Yu Cai, San Jose, CA (US); Johnson Yen, Fremont, CA (US); Ngok Ying Chu, Los Altos, CA (US)

(73) Assignee: SK hynix memory solutions Inc., San Jose, CA (US)

( * ) Notice: Subject to any disclaimer, the term of this patent is extended or adjusted under 35 U.S.C. 154(b) by 0 days.

(21) Appl. No.: 15/071,986

(22) Filed: Mar. 16, 2016

(65) Prior Publication Data

US 2016/0276039 A1 Sep. 22, 2016

Related U.S. Application Data

(60) Provisional application No. 62/133,754, filed on Mar. 16, 2015.

(51) Int. Cl.
*G11C 7/00* (2006.01)
*G11C 16/28* (2006.01)
*G11C 16/34* (2006.01)

(52) U.S. Cl.
CPC .......... *G11C 16/28* (2013.01); *G11C 16/3404* (2013.01)

(58) Field of Classification Search
CPC .......... G11C 29/08; G11C 29/42; G11C 29/44
USPC .......... 365/200, 201, 230.06, 230.03
See application file for complete search history.

(56) References Cited

U.S. PATENT DOCUMENTS

| | | |
|---|---|---|
| 9,043,681 B2 | 5/2015 | Kalavade et al. |
| 2014/0040704 A1* | 2/2014 | Wu .......... G11C 29/52 714/773 |
| 2014/0164865 A1 | 6/2014 | Sharon et al. |
| 2014/0185377 A1 | 7/2014 | Kim et al. |
| 2015/0143202 A1* | 5/2015 | Chen .......... H03M 13/1111 714/773 |
| 2015/0178154 A1 | 6/2015 | Kim et al. |

* cited by examiner

*Primary Examiner* — Han Yang
(74) *Attorney, Agent, or Firm* — IP & T Group LLP

(57) ABSTRACT

A method for operating a memory controller includes: performing a hard decision read operation to read hard decision data from a memory device; if a hard decoding for the hard decision data fails, assigning log likelihood ratio (LLR) values to cells falling in a plurality of voltage regions corresponding to a plurality of read reference voltages; performing a soft decision read operation based on the LLR values and a soft decoding for the soft decision data to generate an error free data; performing a read operation to read data from the memory device using each of the plurality of read reference voltages to generate raw data for each of the plurality of read reference voltages; and determining an optimal read reference voltage among the plurality of the read reference voltages based on the raw data and the error free data.

20 Claims, 11 Drawing Sheets

MEMORY CONTROLLER AND OPERATING METHOD THEREOF

CROSS-REFERENCE TO RELATED APPLICATIONS

This application claims the benefit of U.S. Provisional Application No. 62/133,754 filed Mar. 16, 2015, the entire contents of which are incorporated herein by reference.

BACKGROUND

1. Field

Exemplary embodiments of the present disclosure relate to a memory controller and an operating method thereof.

2. Description of the Related Art

Semiconductor memory devices are generally classified into volatile memory devices, such as a dynamic random access memory (DRAM) and a static RAM (SRAM), and nonvolatile memory devices, such as a read only memory (ROM), a mask ROM (MROM), a programmable ROM (PROM), an erasable PROM (EPROM), an electrically EPROM (EEPROM), a ferromagnetic RAM (FRAM), a phase change RAM (PRAM), a magnetoresistive RAM (MRAM), a resistive RAM (RRAM) and a flash memory.

Volatile memory devices lose their stored data when their power supply is interrupted, whereas nonvolatile memory devices retain their data even without a constant source of power. Flash memory devices are widely used as a storage medium in computer systems because of their high program speed, low power consumption and large data storage capacity.

In nonvolatile memory devices, especially in flash memory devices, data states storable in each memory cell are determined based on the number of bits stored in the memory cell. A memory cell storing 1-bit data per cell is called a single-bit cell or a single-level cell (SLC). A memory cell storing multiple bits of data (i.e., 2 or more bits data) per cell is called a multi-bit cell, a multi-level cell (MLC) or a multi-state cell. The multi-bit cell is advantageous because it allows more data to be stored in a limited area. However, as the number of bits programmed in each memory cell increases, the reliability decreases and the read failure rate increases. What is therefore required is a scheme for precisely determining optimal read voltages for data stored in memory cells of a semiconductor memory device.

SUMMARY

Embodiments of the present disclosure are directed to a memory controller and an operating method thereof capable of precisely determining optimal read voltages for data stored in memory cells.

Aspects of the invention include a method for operating a memory controller. The method includes: performing a hard decision read operation to read hard decision data from a memory device; if a hard decoding for the hard decision data fails, assigning log likelihood ratio (LLR) values to cells falling in a plurality of voltage regions corresponding to a plurality of read reference voltages; performing a soft decision read operation based on the LLR values and a soft decoding for the soft decision data to generate an error free data; performing a read operation to read data from the memory device using each of the plurality of read reference voltages to generate raw data for each of the plurality of read reference voltages; and determining an optimal read reference voltage among the plurality of the read reference voltages based on the raw data and the error free data.

Other aspects of the invention include a method for operating a memory controller. The method includes: performing a soft decision read operation for cells from a memory device, falling in a plurality of voltage regions within a predetermined region corresponding to a plurality of read reference voltages; performing a soft decoding for the soft decision data to generate an error free data; performing a read operation using each of the plurality of read reference voltages to generate raw data for each of the plurality of read reference voltages; and determining an optimal read reference voltage among the plurality of the read reference voltages based on the raw data and the error free data.

Further aspects of the invention include a controller for controlling a memory device. The controller includes: a first read processing unit for performing a hard decision read operation to read hard decision data from the memory device; a second read processing unit for, if a hard decoding for the hard decision data fails, assigning log likelihood ratio (LLR) values to cells falling in a plurality of voltage regions corresponding to a plurality of read reference voltages, and performing a read operation to read data from the memory device using each of the plurality of read reference voltages to generate raw data for each of the plurality of read reference voltages; a third read processing unit for performing a soft decision read operation based on the LLR values and a soft decoding for the soft decision data to generate an error free data; and a determiner for determining an optimal read reference voltage among the plurality of the read reference voltages based on the raw data and the error free data.

Still further aspects of the invention include a controller for controlling a memory device. The controller includes: a first unit for performing a soft decision read operation for cells from a memory device, falling in a plurality of voltage regions within a predetermined region corresponding to a plurality of read reference voltages and a soft decoding for the soft decision data to generate an error free data; a second unit for performing a read operation using each of the plurality of read reference voltages to generate raw data for each of the plurality of read reference voltages; and a determiner for determining an optimal read reference voltage among the plurality of the read reference voltages based on the raw data and the error free data.

DETAILED DESCRIPTION

Figure 1:
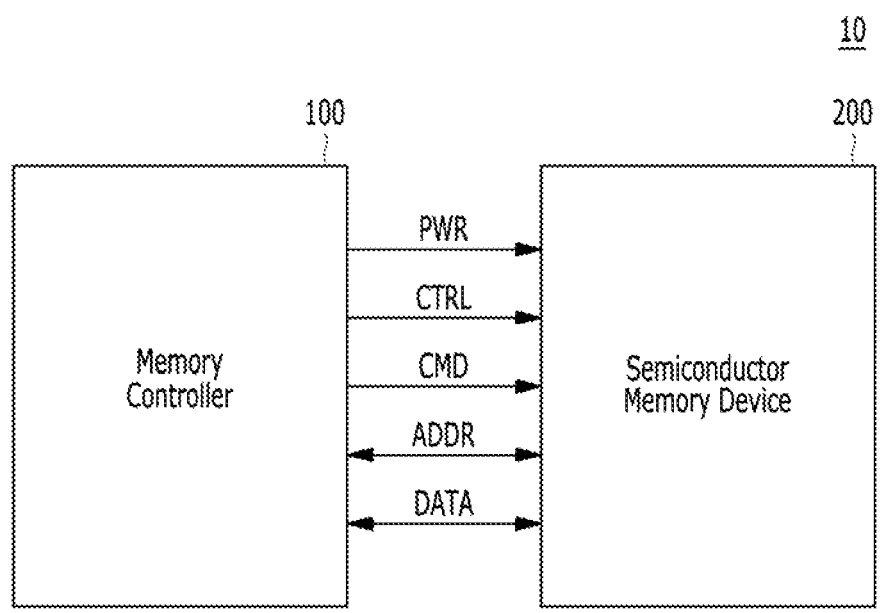
FIG. 1 is a block diagram schematically illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
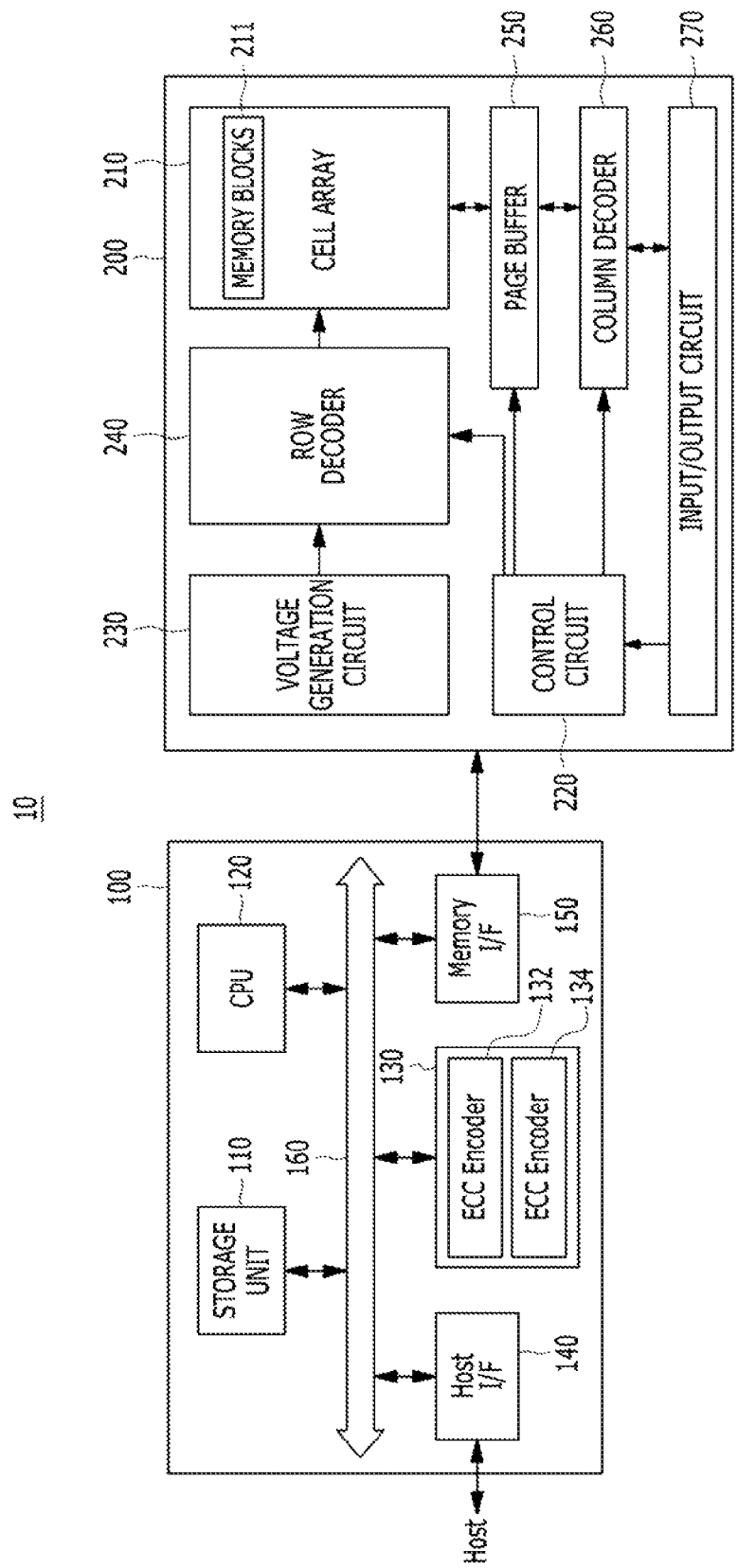
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may be the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a central processing unit (CPU) 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The CPU (or processor) 120 may control general operations of the memory system 10, and a write operation or a read operation for the memory device 200, in response to a write request or a read request from the host device. The CPU 120 may drive firmware, which is referred to as a flash translation layer (FTL), to control the general operations of the memory system 10. For example, the FTL may perform operations such as logical to physical (L2P) mapping, wear leveling, garbage collection, and bad block handling.

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits. The ECC unit 130 may include an ECC encoder 132 and an ECC decoder 134.

The ECC encoder 132 may perform error correction encoding on data to be programmed into the memory device 200 to output data to which parity bits are added. The parity bits may be stored in the memory device 200.

The ECC decoder 134 may perform error correction decoding on data read from the memory device 200. The ECC decoder 134 may determine whether the error correction decoding is successful, and may output an instruction signal based on the determination result. The ECC decoder 134 may correct error bits of data using parity bits generated by the ECC encoding.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an Integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
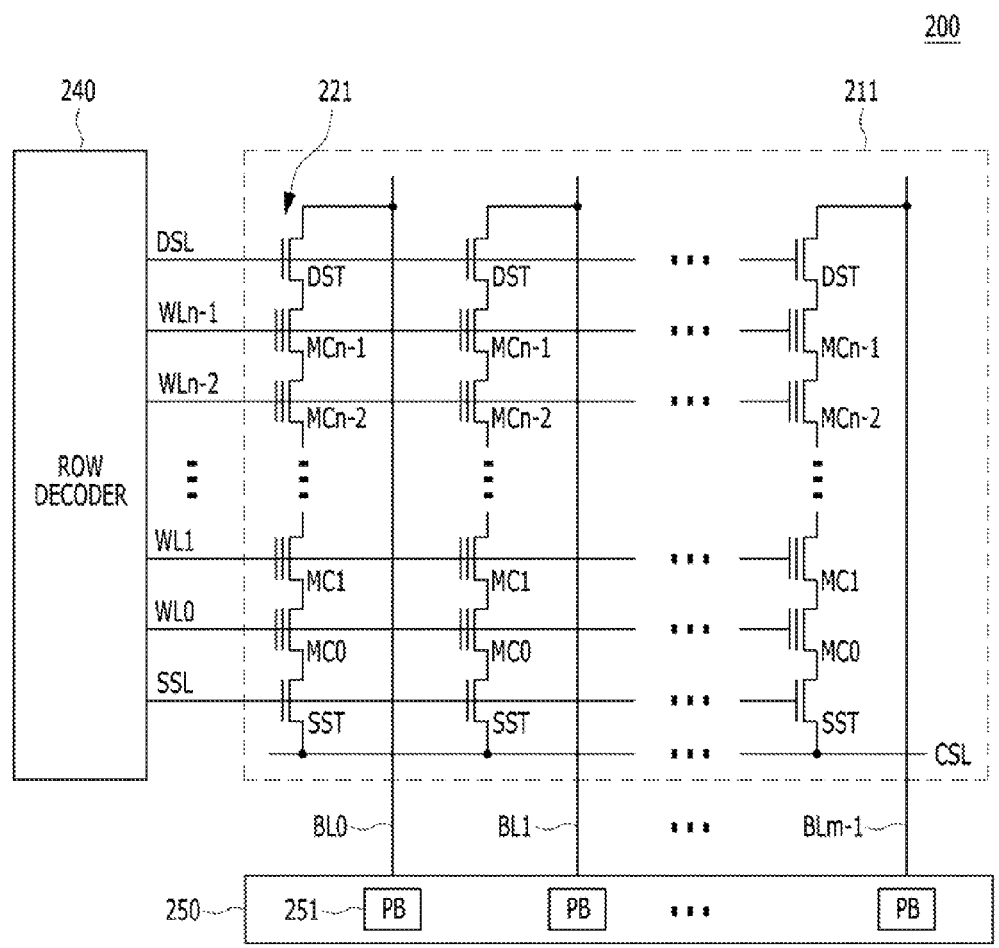
FIG. 3 is a circuit diagram illustrating a memory block of a semiconductor memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm-1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn-1 may be formed of a multi-level cell (MLC) storing data Information of multiple bits in each cell. The cell strings 221 may be electrically coupled to the corresponding bit lines BL0 to BLm-1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

As described above, the controller 100 of the memory system (or storage system) may perform error correction decoding on data read from the memory device 200. For example, the controller 100 may perform low-density parity check (LDPC) hard decoding for the read data from the memory device 200. When the LDPC hard decoding fails, the controller 100 may initiate a procedure (e.g., the eBoost) to find the optimal read reference voltage that can achieve the minimum raw bit error rate.

Figure 4:
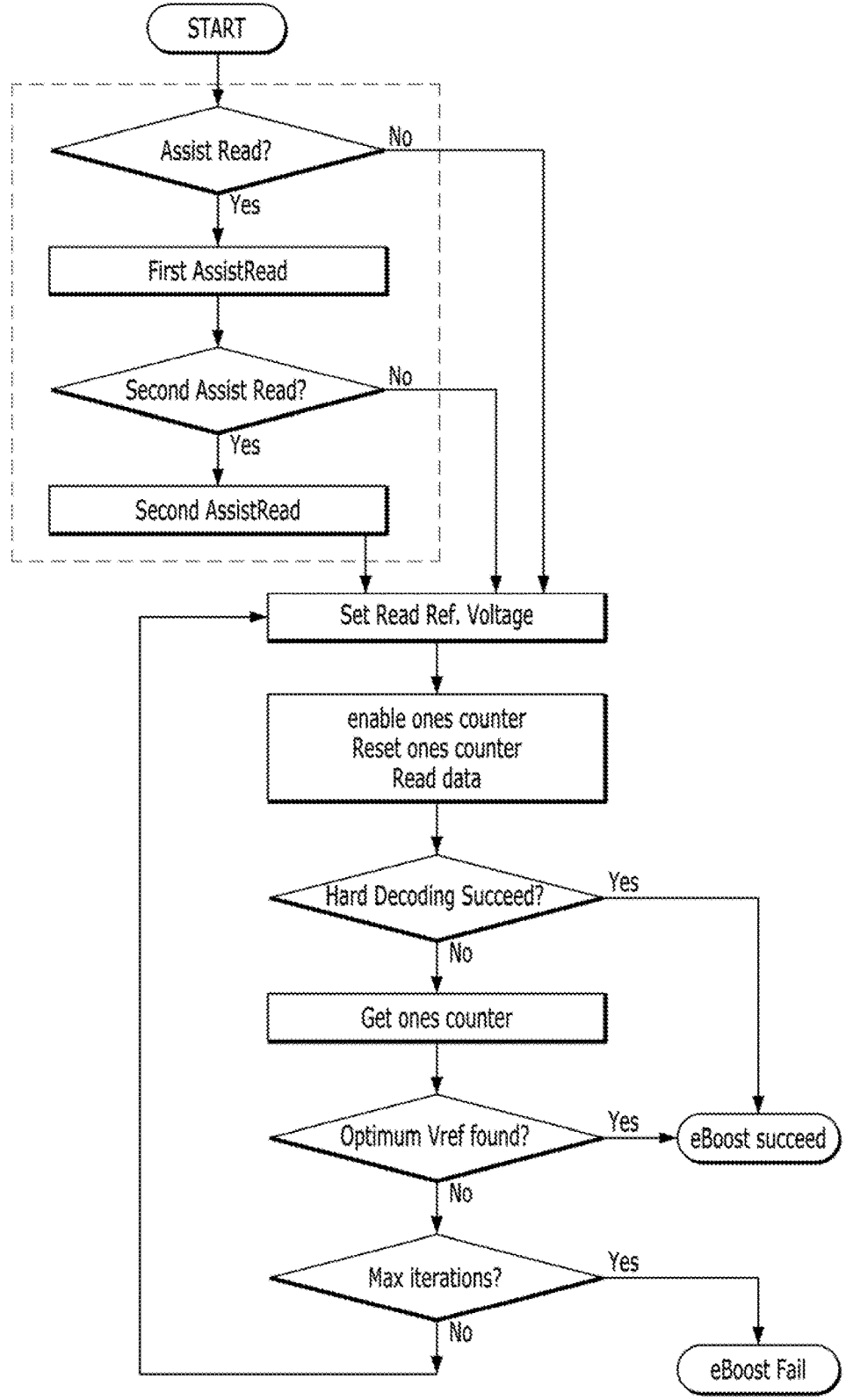
FIG. 4 is a flowchart of steps of an eBoost procedure according to aspects of the invention.

The eBoost procedure will try different sets of read reference voltages to read the memory device 200 (e.g., flash memory) and identify the number of cells read as 1 or 0 in each finite bin. Then, the number of cells for a stored voltage falling in each region can be identified. Even if the hard decoding of each eBoost read fails, the eBoost procedure may still find the optimal read reference voltage by identifying the region with the smallest number of cells because the optimal read reference voltage is at the cross point of neighbor distributions and the region around the optimal read reference voltage typically has the smallest number of flash cells. A typical eBoost procedure is shown in FIG. 4.

The eBoost procedure tries different sets of read reference voltages to read the memory device 200 (e.g., flash memory) and identify the number of cells read as 1 or 0 in each finite bin. Then, the number of cells for a stored voltage falling in each region can be identified. Even if the hard decoding of each step in the eBoost procedure read fails, the eBoost procedure may still find the optimal read reference voltage by identifying the region with the smallest number of cells.

Figure 5A:
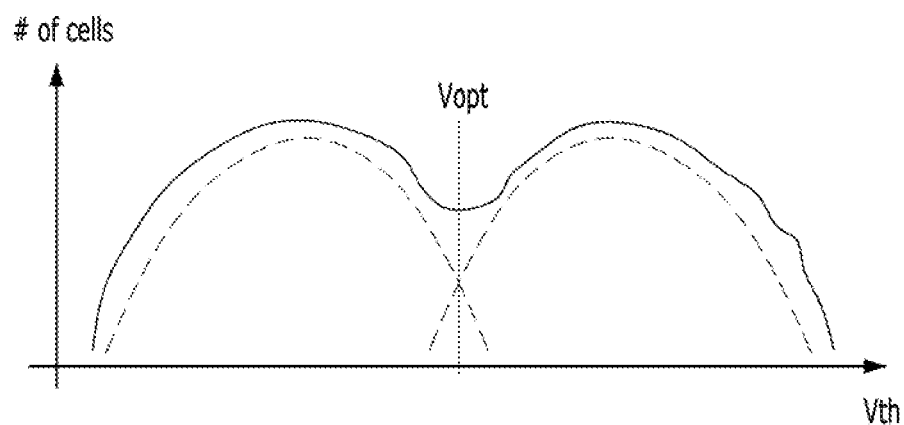
FIGS. 5A, 5B, and 5C are diagrams showing various distributions in accordance with aspects of the invention.
Figure 5B:
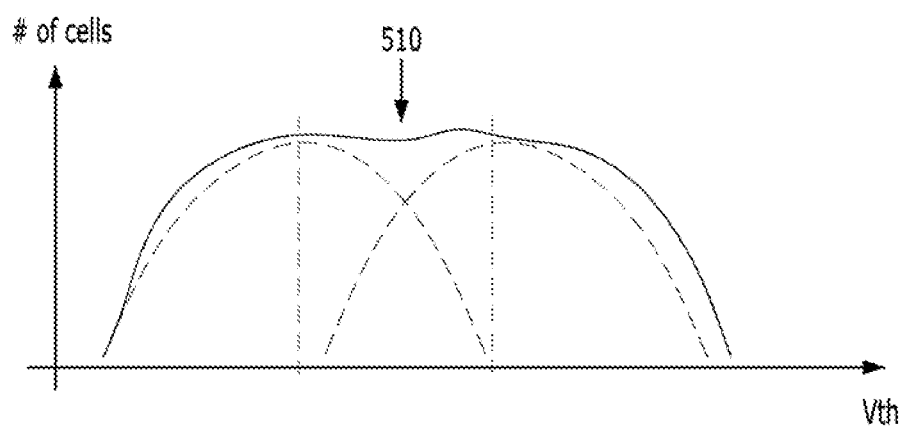

However, as more bits are programmed per cell (e.g., triple level cell (TLC) flash, which has 3 bits per cell) and the size of flash cells scales down, the distance of neighbor distribution may become smaller and the width of the distribution of each state (e.g., program and erase state) may become wider. For example, as shown in FIG. 5A, an optimal reference voltage Vopt that may be found by eBoost is shown. However, the distribution shown in FIG. 5B is one in which eBoost cannot identify the optimum voltage using the criteria of local minimum of overall observable distribution. The overall distribution that can be observable near the optimal read reference voltage may be so flat (e.g., FIG. 5B) that it is hard to identify the region of optimal threshold voltage by finding the bin with the smallest number of flash cells. In the meantime, each hard LDPC decoding for each trial reference voltage also fails. Then, it is difficult to judge which reference voltage is the optimal.

Figure 5C:
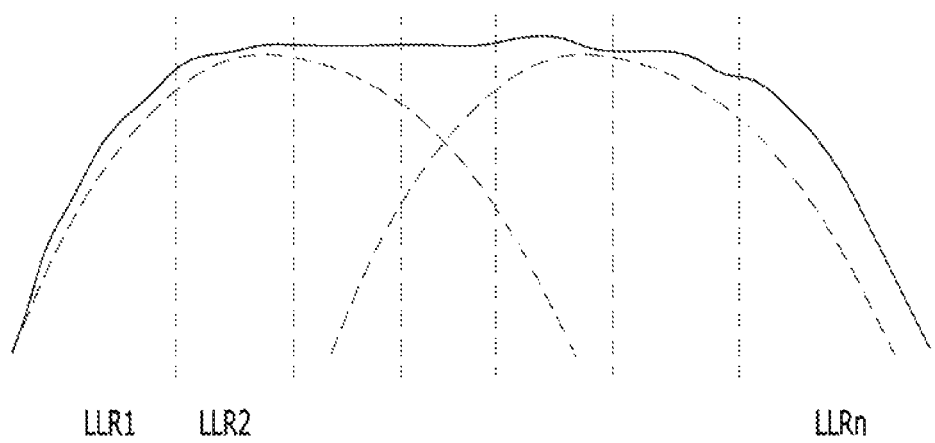

Accordingly, embodiments of the present invention are to precisely determine, even if threshold voltage distributions are in a flat region shown in FIG. 5B, optimal read voltages for data stored in memory cells. FIG. 5C is an example illustration of assigning LLRs to different threshold voltages, as is described below.

Embodiments of the present invention include leveraging the information generated during the eBoost procedure to trigger soft decoding in parallel with the eBoost procedure. This is useful because soft decoding in general has much stronger error correction capability than hard decoding. The probability of soft decoding to succeed is much higher than that of hard decoding. Once the soft decoding succeeds, it is possible to get the corrected read data without any error (i.e., error free data). Then, the flat region of the distribution that contains optimal read reference voltage is scanned to identify the threshold voltage with the minimum raw bit error rate, which is the optimal rate that the eBoost procedure targets to find.

Figure 6:
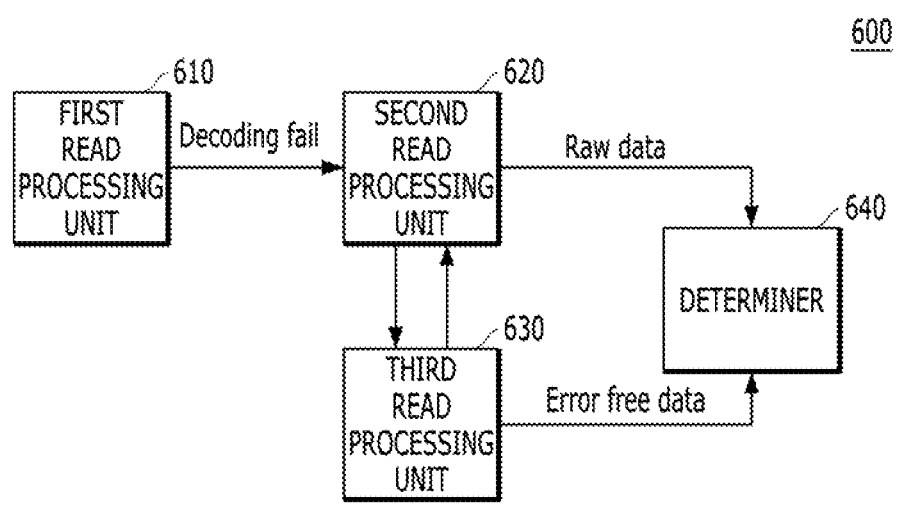
FIG. 6 is a block diagram illustrating an apparatus for selecting an optimal read reference voltage in accordance with aspects of the invention.

FIG. 6 is a block diagram Illustrating an apparatus 600 for selecting an optimal read reference voltage in accordance with an embodiment of the present invention. For example, the apparatus 600 may be implemented in the controller 100 (i.e., the ECC unit 130) shown in FIG. 2.

Referring to FIG. 6, the apparatus 600 includes a first read processing unit 610, a second read processing unit 620, a third read processing unit 630 and a determiner 640.

The first read processing unit 610 may perform a hard decision read operation to read hard decision data from the memory device 200 of FIG. 1, and perform a hard decoding for the hard decision data. In some embodiments, the first read processing unit 610 may perform the hard decoding based on a LDPC code. If the hard decoding for the hard decision data fails, the first read processing unit 610 may generate a signal indicating that the hard decoding for the hard decision data fails.

If the hard decoding for the hard decision data by the first read processing unit 610 fails, the second read processing unit 620 may assign log likelihood ratio (LLR) values to cells falling in a plurality of voltage regions corresponding to a plurality of read reference voltages. Further, the second read processing unit 620 may perform a read operation to read data from the memory device 200 using each of the plurality of read reference voltages. Thus, raw data for each of the plurality of read reference voltages may be generated.

The third read processing unit 630 may perform a soft decision read operation based on the LLR values and perform a soft decoding for the soft decision data. By the soft decoding, an error free data may be generated.

The determiner 640 may compare the raw data with the error free data, and calculate the total number of errors for the raw data based on the comparison result. Then, the determiner 640 may select a read reference voltage with the minimum number of errors among the plurality of the read reference voltages as the optimal read reference voltage. In other words, the determiner 640 may determine an optimal read reference voltage among the plurality of the read reference voltages based on the raw data and the error free data.

In some embodiments, the determiner 640 may compare the raw data with the error free data by performing an exclusive-OR (XOR) operation both the raw data and the error free data to generate XORed data. The determiner 640 may calculate the total number of errors for the raw data by counting at least one error bit in a plurality of bit locations of the XORed data.

Figure 7:
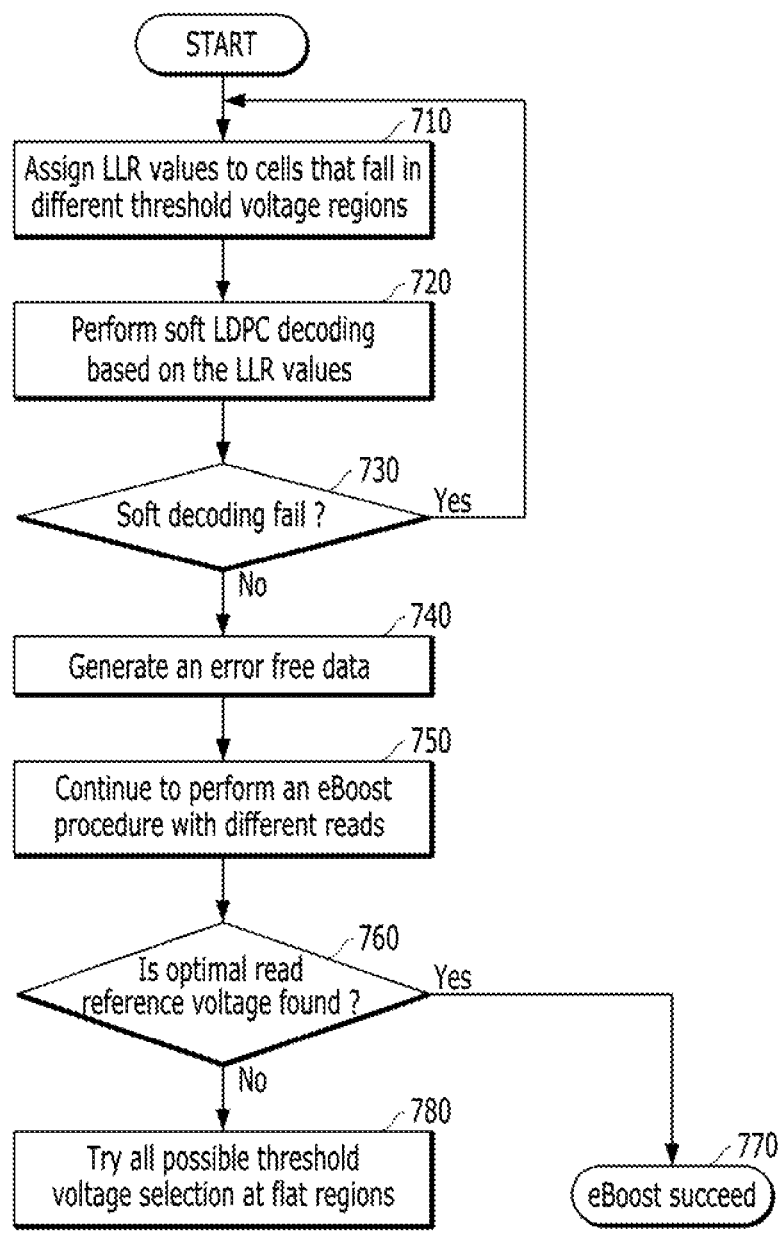
FIG. 7 is a flow chart illustrating an operation for selecting an optimal read reference voltage in accordance with aspects of the invention.

FIG. 7 is a flow chart illustrating an operation for selecting an optimal read reference voltage in accordance with an embodiment of the present invention. For example, the operation of FIG. 7 may be performed by the controller 100 (i.e., the ECC unit 130) shown in FIG. 2 or the apparatus 600 shown in FIG. 6.

Referring to FIG. 7, at step 710, the controller 100 assigns log likelihood ratio (LLR) values to flash cells that fall in different threshold voltage regions that can be separated by the eBoost procedure. As the eBoost procedure attempts to read with different threshold voltages sequentially, after a few steps of the eBoost procedure, the threshold voltage region may be divided into a few bins. Such Information to assign LLR values to cells that fall in different region may be leveraged. Selecting to assign LLR values may be performed at any stage of the eBoost procedure, regardless of the number of eBoost steps that have been executed.

At step 720, the controller 100 may perform the soft decoding based on the LLR values. In other words, at the end of each step in the eBoost procedure, soft decoding (e.g., soft LDPC decoding) may be triggered based on the LLR values assigned at step 710.

At step 730, the controller 100 checks whether the soft decoding fails. If the soft decoding fails, the controller 100 triggers another read with another set of read reference voltages similar to typical eBoost procedures. Then, the controller 100 goes back to step 710.

After multiple iterations, it is possible that the hard decoding of each read of the eBoost procedure still fails, but one of the soft decoding may be successful because the hard decoding can only use the information of each read step separately, while the soft decoding can combine the information of all the read steps to do decoding. Thus, at step 740, error free data may be generated after the soft decoding.

At step 750, the eBoost procedure is continued to be performed (e.g., by the controller 100) with different reads using ones counter information to find the flat region, which has the least number of cells and is supposed to be the optimum read reference voltage.

Referring again to FIG. 7, at step 760, the controller 100 checks whether the optimal read reference voltage is found. If the optimal read reference voltage is found, at step 770, the controller 100 indicates that the eBoost procedure is successful. Otherwise, the controller 100 triggers the procedure in step 780 to assist finding the optimal read reference voltage.

As step 780, the controller 100 tries all possible threshold voltage selection at the flat region 510 (e.g., FIG. 5B) that the eBoost procedure cannot identify which is optimal.

Figure 8:
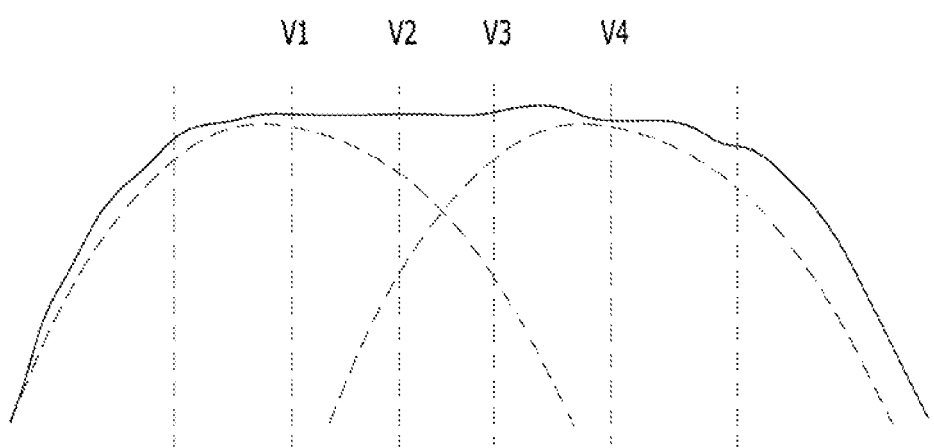
FIG. 8 is a diagram illustrating different read reference voltages used for a read operation in accordance with an embodiment of the present invention.

At the flat region 510 as shown in FIG. 5B, the numbers of cells falling into the flat region are very similar and it is difficult to identify the optimal threshold voltage. However, their raw read values can be significantly different and the error rate may be also significantly different. As illustrated in the example of FIG. 8, threshold voltages V1, V2, V3 and V4 are all in the flat region. The number of cells falling in regions [V1, V2], [V2, V3] and [V3, V4] are close. However, the raw bit errors for each read data when reading with each of threshold voltages V1, V2, V3 and V4 are different. In the traditional read operation, the number of raw errors of these readings is unknown since the ECC decoding with these reference voltages all fail. The ECC decoding cannot report error count and, thus, there is no error free data. However, with the soft LDPC decoding assistance disclosed herein (for example, at step 780), it can get the error free data copy in step 720. Thus, the disclosed processes and methods are able to count the number of errors by comparing the raw data read with these voltages with the error free data.

In the flat region as illustrated in FIG. 8, it is assumed that there is a plurality of read reference voltages that are difficult to select one optimal voltage from among the plurality of the read reference voltages. In this case, the controller 100 may perform an operation for selecting an optimal read reference voltage among the plurality of the read reference voltages.

Figure 9:
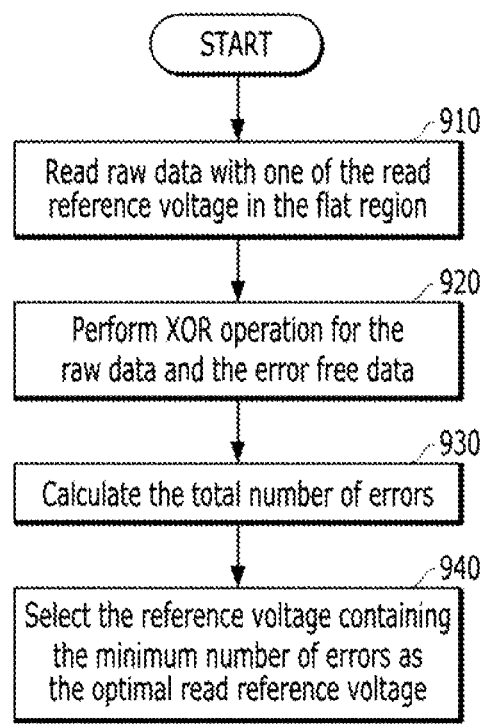
FIG. 9 is a flow chart illustrating an operation for selecting an optimal read reference voltage in a flat region in accordance with an embodiment of the present invention.

FIG. 9 is a flow chart illustrating an operation for selecting an optimal read reference voltage in a flat region in accordance with an embodiment of the present invention. For example, the operation of FIG. 7 may be performed by the controller 100 (i.e., the ECC unit 130) in FIG. 2 and/or the apparatus 500 in FIG. 5.

Referring to FIG. 9, at step 910, the controller 100 reads raw data with one of the read reference voltage in the flat region (e.g., V1). Then, the controller 100 gets the raw data without any decoding and loads the raw data into a buffer (not shown).

Figure 10:
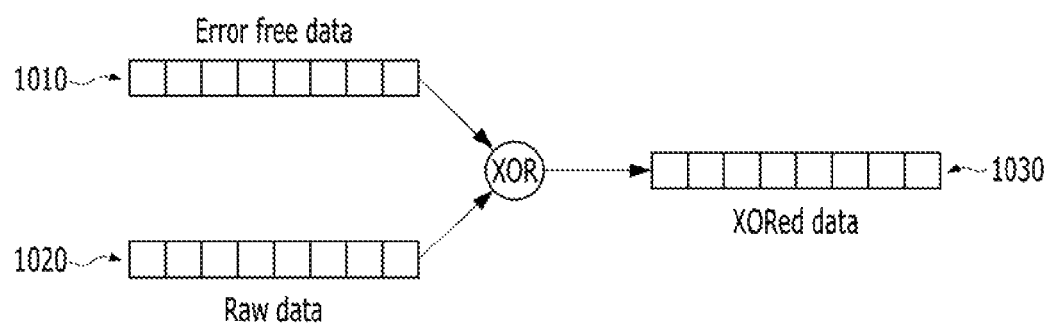
FIG. 10 is a diagram illustrating an exclusive-OR (XOR) operation on both raw data and an error free data in accordance with the present invention.

At step 920, the controller 100 performs an exclusive-OR (XOR) operation for the raw data and the error free data obtained by the soft decoding in step 720 of FIG. 7. That is, as shown in FIG. 10, the raw read data 1020 is XORed with the error free data 1010 to generate the XORed data 1030. If a certain bit of the XORed data 1030 has an error, the XORed data 1030 in the corresponding bit location will be 1. Otherwise, it will be zero.

At step 930, the XORed data is sent to a ones counter and then the controller 100 calculates the total number of errors. Such error counts will be recorded. If there are still some possible read reference voltages have not been tried, the controller 100 selects another set of read reference voltage in the list associated with the flat region. For another read reference voltage, steps 910 to 930 are performed. If the error count of all possible read reference voltages in the flat region has been calculated, the controller 100 goes to step 940.

At step 940, the controller 100 selects the read reference voltage that contains the minimum number of errors as the optimal read reference voltage.

The examples disclosed herein illustrative and not meant to be exclusive. Any methods that use the soft decoding during the eBoost procedure to get the error free data and based on such error free data to select the read reference voltage that the raw data reading with such voltage contains the minimum number deviation from such error free soft LDPC decoding data is within the scope of this disclosure.

This technique is useful because the likelihood that the eBoost procedure can find the optimal read reference voltage is improved. One benefit is that soft decoding can be started early during the eBoost procedure to reduce the latency. Another benefit is that the optimal read reference voltage can be found when the threshold voltage distribution at the border of two neighboring threshold voltage distribution are close (i.e., the optimal read reference voltage can be found even under conditions where the traditional eBoost procedure cannot find the optimal read reference voltage). Without this technique, the eBoost procedure could not find the optimal read reference voltage in the flat region. With this technique, the likelihood of finding the optimal one is much higher.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method comprising:
    performing a hard decision read operation to read hard decision data from a memory device;
    if a hard decoding for the hard decision data fails, assigning log likelihood ratio (LLR) values to cells falling in a plurality of voltage regions corresponding to a plurality of read reference voltages;
    performing a soft decision read operation based on the LLR values and a soft decoding for the soft decision data to generate an error free data;
    performing a read operation to read data from the memory device using each of the plurality of read reference voltages to generate raw data for each of the plurality of read reference voltages; and
    determining an optimal read reference voltage among the plurality of the read reference voltages based on the raw data and the error free data.

2. The method of claim 1, wherein determining of the optimal read reference voltage comprises:
    comparing the raw data with the error free data;
    calculating the total number of errors for the raw data based on the comparison result; and
    selecting a read reference voltage with the minimum number of errors among the plurality of the read reference voltages as the optimal read reference voltage.

3. The method of claim 2, wherein comparing of the raw data with the error free data comprises;
    performing an exclusive-OR (XOR) operation both the raw data and the error free data to generate XORed data.

4. The method of claim 3, wherein the XORed data includes a plurality of bit locations, and
    wherein calculating of the total number of errors for the raw data comprises counting at least one error bit in the bit locations of the XORed data.

5. The method of claim 1, further comprising:
    determining whether the hard decoding for the hard decision data fails.

6. A method comprising:
    performing a soft decision read operation for cells from a memory device, falling in a plurality of voltage regions within a predetermined region corresponding to a plurality of read reference voltages;
    performing a soft decoding for the soft decision data to generate an error free data;
    performing a read operation using each of the plurality of read reference voltages to generate raw data for each of the plurality of read reference voltages; and
    determining an optimal read reference voltage among the plurality of the read reference voltages based on the raw data and the error free data.

7. The method of claim 6, wherein determining of the optimal read reference voltage comprises:
    comparing the raw data with the error free data;
    calculating the total number of errors for the raw data based on the comparison result; and
    selecting a read reference voltage with the minimum number of errors among the plurality of the read reference voltages as the optimal read reference voltage.

8. The method of claim 7, wherein comparing of the raw data with the error free data comprises performing an exclusive-OR (XOR) operation both the raw data and the error free data to generate XORed data.

9. The method of claim 8, wherein the XORed data includes a plurality of bit locations, and
    wherein calculating of the total number of errors for the raw data comprises counting at least one error bit in the bit locations of the XORed data.

10. The method of claim 6, further comprising:
    performing a hard decision read operation to read hard decision data from the memory device,
    wherein the performing of the soft decision read operation is performed, if a hard decoding for the hard decision data fails.

11. A controller for controlling a memory device, comprising:
    a first read processing unit suitable for performing a hard decision read operation to read hard decision data from the memory device;
    a second read processing unit suitable for, if a hard decoding for the hard decision data fails, assigning log likelihood ratio (LLR) values to cells falling in a plurality of voltage regions corresponding to a plurality of read reference voltages, and performing a read operation to read data from the memory device using each of the plurality of read reference voltages to generate raw data for each of the plurality of read reference voltages;
    a third read processing unit suitable for performing a soft decision read operation based on the LLR values and a soft decoding for the soft decision data to generate an error free data; and
    a determiner suitable for determining an optimal read reference voltage among the plurality of the read reference voltages based on the raw data and the error free data.

12. The controller of claim 11, wherein the determiner is suitable for:
    comparing the raw data with the error free data;
    calculating the total number of errors for the raw data based on the comparison result; and
    selecting a read reference voltage with the minimum number of errors among the plurality of the read reference voltages as the optimal read reference voltage.

13. The controller of claim 12, wherein the determiner is suitable for comparing the raw data with the error free data by performing an exclusive-OR (XOR) operation both the raw data and the error free data to generate XORed data.

14. The controller of claim 13, wherein the XORed data includes a plurality of bit locations, and
    wherein the determiner is suitable for calculating the total number of errors for the raw data by counting at least one error bit in the bit locations of the XORed data.

15. The controller of claim 11, wherein the first read processing unit is further suitable for determining whether the hard decoding for the hard decision data fails.

16. A controller for controlling a memory device, comprising:

a first unit suitable for performing a soft decision read operation for cells from a memory device, falling in a plurality of voltage regions within a predetermined region corresponding to a plurality of read reference voltages and a soft decoding for the soft decision data to generate an error free data;

a second unit suitable for performing a read operation using each of the plurality of read reference voltages to generate raw data for each of the plurality of read reference voltages; and a determiner suitable for determining an optimal read reference voltage among the plurality of the read reference voltages based on the raw data and the error free data.

17. The controller of claim 16, wherein the determiner is suitable for comparing the raw data with the error free data; calculating the total number of errors for the raw data based on the comparison result; and selecting a read reference voltage with the minimum number of errors among the plurality of the read reference voltages as the optimal read reference voltage.

18. The controller of claim 17, wherein the determiner is suitable for comparing the raw data with the error free data by performing an exclusive-OR (XOR) operation both the raw data and the error free data to generate XORed data.

19. The controller of claim 18, wherein the XORed data includes a plurality of bit locations, and wherein the determiner is suitable for calculating the total number of errors for the raw data by counting at least one error bit in the bit locations of the XORed data.

20. The controller of claim 16, further comprising:

a third unit suitable for performing a hard decision read operation to read hard decision data from the memory device, wherein the first unit is suitable for performing the soft decision read operation, if a hard decoding for the hard decision data fails.

* * * * *